(12) United States Patent
Bauler et al.

(10) Patent No.: US 9,807,571 B1
(45) Date of Patent: Oct. 31, 2017

(54) HIGH RATE VHF DATALINK

(71) Applicant: Rockwell Collins, Inc., Cedar Rapids, IA (US)

(72) Inventors: Scott F. Bauler, Melbourne, FL (US); William T. Greenleaf, Indialantic, FL (US); Neil J. Earnhardt, Melbourne, FL (US); Joel M. Wichgers, Urbana, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days.

(21) Appl. No.: 15/236,224

(22) Filed: Aug. 12, 2016

(51) Int. Cl.
| | |
|---|---|
| *H04W 24/00* | (2009.01) |
| *H04W 4/04* | (2009.01) |
| *H04L 27/18* | (2006.01) |
| *H04B 7/06* | (2006.01) |
| *H04B 7/26* | (2006.01) |
| *H04W 64/00* | (2009.01) |
| *H04B 1/04* | (2006.01) |

(52) U.S. Cl.
CPC .......... *H04W 4/046* (2013.01); *H04B 7/0639* (2013.01); *H04B 7/2646* (2013.01); *H04L 27/18* (2013.01); *H04W 64/00* (2013.01); *H04B 2001/0408* (2013.01)

(58) Field of Classification Search
USPC ...................................................... 455/456.6
See application file for complete search history.

(56) References Cited

U.S. PATENT DOCUMENTS 7,239,266 B2 * 7/2007 Vacanti .................. G01S 7/032
342/103

* cited by examiner

*Primary Examiner* — Joel Ajayi
(74) *Attorney, Agent, or Firm* — Donna P. Suchy; Daniel M. Barbieri

(57) ABSTRACT

A very high frequency (VHF) transceiver can include an amplitude and phase shift keying (APSK) modulator configured to modulate signals for transmission across a first VHF channel of a plurality of VHF channels used to communicate between or among aircraft and one or more ground stations. Each of the VHF channels can have a bandwidth of at least 8.33 kilo Hertz (kHz) with a data rate per Hertz (Hz) greater than or equal to 3 bits per second per Hz (bps/Hz). The VHF transceiver can include a power amplifier configured to amplify the modulated signals prior to the transmission. The VHF transceiver can include a linearity controller configured to control linearity of the power amplifier according to at least one of a Cartesian feedback amplifier linearization, pre-distortion amplifier linearization or feedforward amplifier linearization to mitigate nonlinear distortion associated with signals output by the power amplifier.

16 Claims, 5 Drawing Sheets

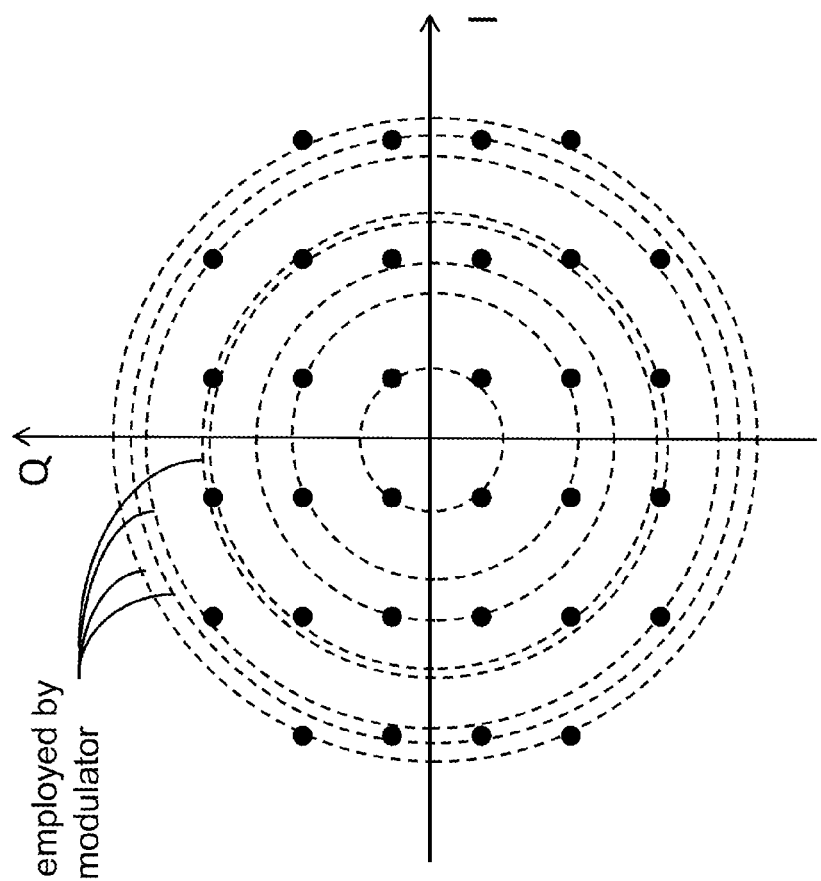
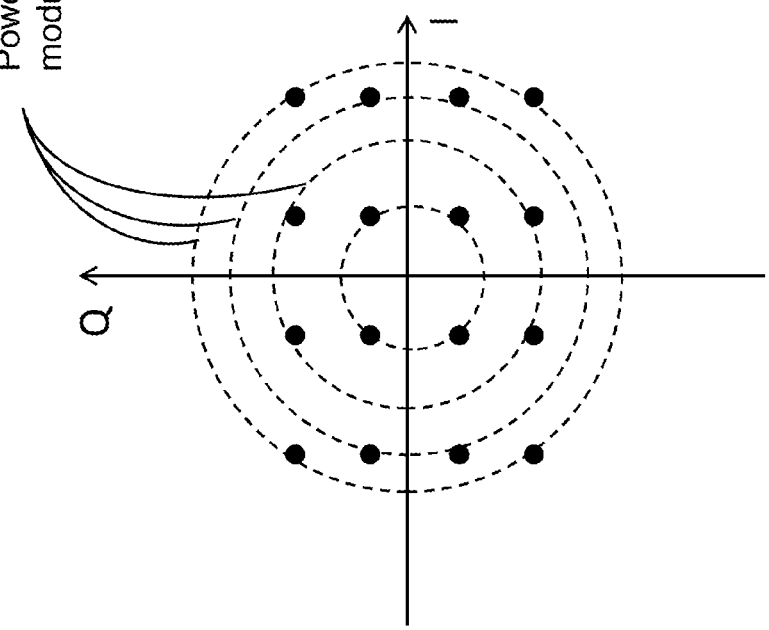
FIG. 3B
FIG. 3A
Power levels employed by modulator/demodulator

HIGH RATE VHF DATALINK

BACKGROUND

Air Traffic Control (ATC) and Airline Operational Control (AOC) ground stations continuously communicate with aircraft to monitor and manage air traffic and/or safety of aircraft. In particular, aircraft and ground stations communicate with each other to exchange air traffic data, such data indicative of identification, location and speed of aircraft, weather data, such as graphical weather descriptions, and/or flight safety data, such as engine/aircraft health monitoring data. Aircraft also communicate with each other to exchange collision avoidance information. The collision avoidance information transmitted by a given aircraft can include, for example, data indicative of the identification, location and speed of that aircraft. Data exchanged among aircraft and/or between aircraft and ground stations allows flight crews and air traffic service providers to monitor in real time information that is relevant for managing the operations and safety of aircraft.

Many aircraft and ground stations may employ very high frequency (VHF) communications as a standard technology to communicate with each other. In particular, certain aircraft and ground stations use VHF Datalink Mode 2 (VDLM2) technology for sending and/or receiving data. Communication systems based on VDLM2 use a Differentially encoded 8-Phase Shift Keying (D8PSK) modulation scheme and provide a plurality of 25 kHz communication channels. Each of the communication channels has a maximum bit rate equal to 31.5 kilo bits per second (kbps).

New air traffic management (ATM) applications proposed for Federal Aviation Administration (FAA) next generation air transportation system (NextGen) and European Aviation and Safety Agency (EASA) Single European Sky ATM Research (SESAR), such as four-dimensional (4D) trajectories, uplinked weather, system wide information management (SWIM), etc., are driving the need for continuously connected aircraft with links capable of exchanging more data. For instance, the 4D trajectory concept integrates time into 3D aircraft trajectory information and involves the exchange of current and predicted positions of an aircraft. Also, the uplinked weather application involves ground stations transmitting extensive weather information (e.g., covering hundreds of square miles) to aircraft. The SWIM program provides an information-sharing platform allowing aircraft, ground stations and other entities to access to real-time, relevant aeronautical, flight, and weather information.

Considering the amount of data transfer associated with the new ATM applications, VDLM2 does not provide sufficient data rate to support these applications. Specifically, the exchange of 4D trajectory data, uplinked weather data, SWIM data and/or data associated with other air transportation applications calls for aeronautical data links with higher bit rates than the data rate provided by existing VDLM2 communication channels. Existing aircraft and/or ground station communications infrastructure are not designed to support high data rate communications.

SUMMARY

In one aspect, the inventive concepts disclosed herein are directed to a very high frequency (VHF) communications transceiver. The VHF transceiver can include an amplitude and phase shift keying (APSK) modulator configured to modulate signals for transmission across a first VHF channel of a plurality of VHF channels used to communicate between or among aircraft and one or more ground stations. Each of the VHF channels can have a bandwidth of at least 8.33 kilo Hertz (kHz), with a data rate per Hertz (Hz) of bandwidth (also sometimes generally referred to as "ratio of data rate to bandwidth") greater than or equal to 3 bits per second per Hz (bps/Hz). The VHF transceiver can include a power amplifier configured to amplify the modulated signals prior to the transmission. The VHF transceiver can include a linearity controller configured to control linearity of the power amplifier according to at least one of a Cartesian feedback amplifier linearization, pre-distortion amplifier linearization or feedforward amplifier linearization to mitigate nonlinear distortion associated with signals output by the power amplifier.

The VHF communications transceiver can be mounted or installed on an aircraft or on a ground vehicle, in some embodiments in accordance with the inventive concepts disclosed herein. The VHF communications transceiver can further include a receiver configured to receive an indication of one or more time slots from the ground station. The one or more ground stations can employ time division multiple access (TDMA) using the one or more time slots for communications with the aircraft or one or more ground vehicles. The VHF communications transceiver can also include a processor configured to select a first time slot of the one or more time slots, and to initiate the transmission according to the first time slot and a timing signal. The timing signal is obtained based on a global navigation satellite system (GLASS) time signal and/or a clock device having a time precision with 100 microseconds. The VHF communications transceiver can have an operational bandwidth ranging between 108 mega Hertz (MHz) and 137 MHz.

The plurality of VHF channels can include at least one channel configured for digital voice communications. The plurality of VHF channels can include at least one channel configured for digital data communications. The VHF communications transceiver can further include an antenna for transmitting the signals output by the power amplifier with mitigated nonlinear distortion such that the transmitted signals can be received by another VHF communications transceiver with uncorrected bit error rate of less than or equal to 0.001. The VHF communications transceiver can further include an antenna with a transmit range of at least two nautical miles. The VHF communications transceiver can further include a processor configured to determine to transmit the modulated signals via the first VHF channel based on one or more factors of the first VHF channel including signal-to-noise ratio, distance between the VHF communications transceiver and one or more receiving devices, relative locations of the VHF communications transceiver and the one or more receiving devices, antenna gain, transmit power, or a combination thereof. In some embodiments, the plurality of VHF channels can be used to communicate between or among the aircraft, the one or more ground stations and one or more ground vehicles.

In a further aspect, the inventive concepts disclosed herein are directed to a system for VHF communications. The system can include a transceiver modulator configured to modulate signals using APSK for amplification using a power amplifier prior to transmission across a first VHF channel of a plurality of VHF channels between or among aircraft and one or more ground stations. The first VHF channel can have a bandwidth of at least 8.33 kilo Hertz (kHz), with a data rate per Hertz (Hz) of bandwidth greater than or equal to 3 bits per second per Hz (bps/Hz). The system can include an amplifier controller configured to control linearity of the power amplifier to support the data rate per Hz greater than or equal to 3 bps/Hz when the bandwidth of the first VHF channel is at least 8.33 kHz, according to at least one of a Cartesian feedback amplifier linearization, pre-distortion amplifier linearization or feed-forward amplifier linearization to mitigate nonlinear distortion associated with signals output by the power amplifier.

The system can be mounted on an aircraft or on a ground vehicle, in some embodiments in accordance with the inventive concepts disclosed herein. The system can further include a receiver configured to receive an indication of one or more time slots from the one or more ground stations. The one or more ground stations can employ TDMA using the one or more time slots for communications with the aircraft. The system can also include a processor configured to select a first time slot of the one or more time slots, and to initiate the transmission according to the first time slot and a timing signal. The timing signal obtained based on a global navigation satellite system (GNSS) time signal or a clock device having time precision within 100 microseconds. The system can have an operational bandwidth ranging between 108 mega Hertz (MHz) and 137 MHz, for instance.

The plurality of VHF channels can include at least one channel configured for digital voice communications. The plurality of VHF channels can include at least one channel configured for digital data communications. The system can further include an antenna for transmitting the signals output by the power amplifier with mitigated nonlinear distortion such that the transmitted signals can be received by a receiving system with uncorrected bit error rate of less than or equal to 0.001. The system can further include an antenna with a transmit range of at least two nautical miles. The system can further include a processor configured to determine to transmit the modulated signals via the first VHF channel, according to one or more factors of the first VHF channel including signal-to-noise ratio, distance between the system and one or more receiving systems, relative locations of the system and the one or more receiving systems, antenna gain, transmit power, or a combination thereof.

In a further aspect, the inventive concepts disclosed herein are directed to a method of transmitting VHF signals. The method can include an APSK modulator modulating signals for transmission across a first VHF channel of a plurality of VHF channels used to communicate between or among aircraft and one or more ground stations. Each of the VHF channels can have a bandwidth of at least 8.33 kilo Hertz (kHz) with a data rate per Hertz (Hz) of bandwidth greater than or equal to 3 bits per second per Hz (bps/Hz). A power amplifier can amplify the modulated signals prior to the transmission. An amplifier linearization controller can adjust linearity of the power amplifier according to at least one of a Cartesian feedback amplifier linearization, pre-distortion amplifier linearization or feedforward amplifier linearization to mitigate nonlinear distortion associated with signals output by the power amplifier.

The method can further include determining, by a processor, to transmit the modulated signals via the first VHF channel, according to one or more factors of the first VHF channel that include signal-to-noise ratio, distance between the VHF communications transceiver and one or more receiving devices, relative locations of the VHF communications transceiver and the one or more receiving devices, antenna gain, transmit power, or a combination thereof.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 3A and 3B show diagrams illustrating example embodiments of two quadrature amplitude modulation (QAM) constellations;

Figure 1:
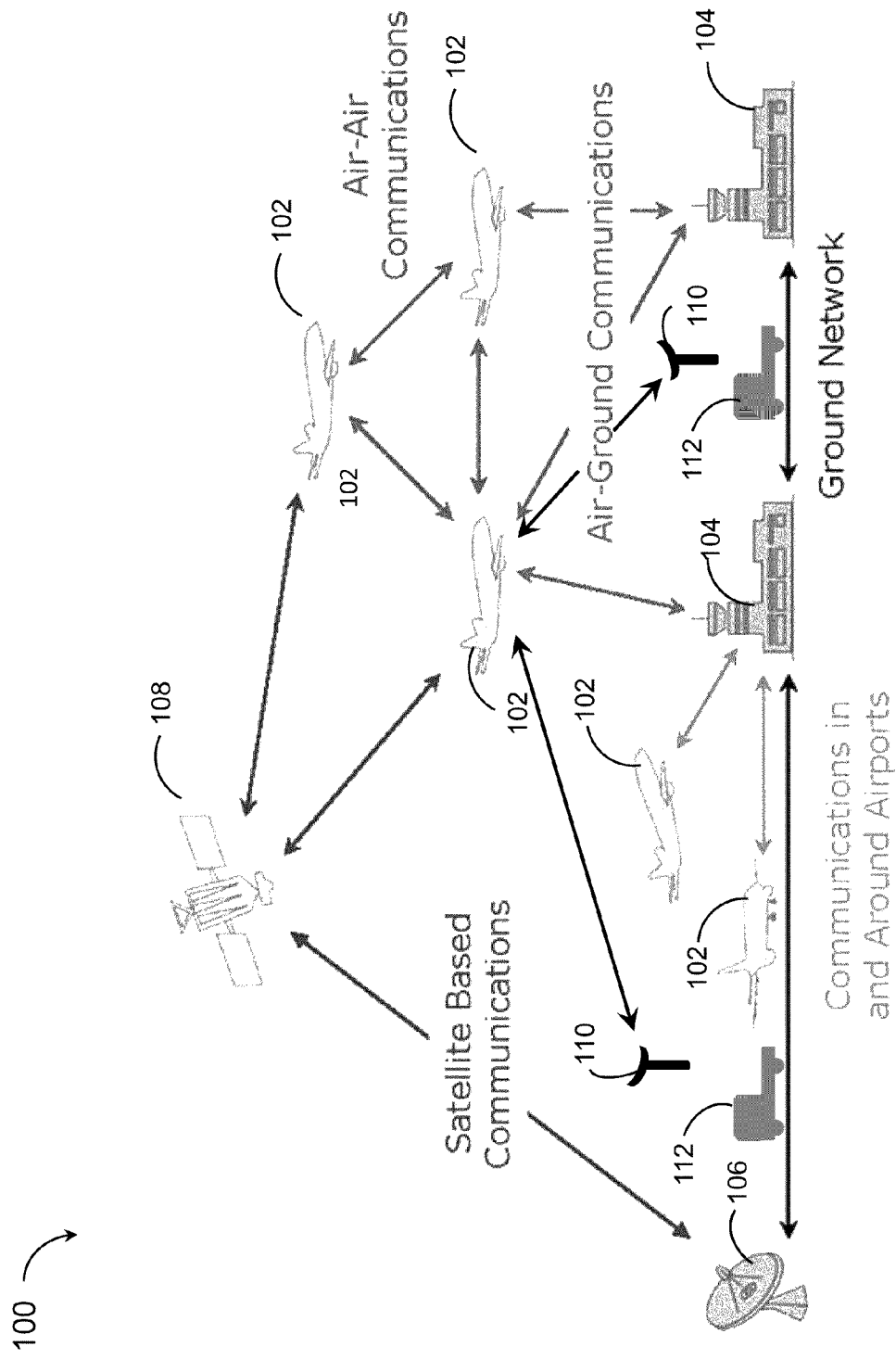
FIG. 1 shows a diagram illustrating an example embodiment of an aeronautical communications environment, according to inventive concepts of this disclosure.

The details of various embodiments of the methods and systems are set forth in the accompanying drawings and the description below.

DETAILED DESCRIPTION

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Referring now to the drawings, FIG. 1 shows a diagram illustrating an aeronautical communications environment 100, according to inventive concepts of this disclosure. The aeronautical communications environment 100 includes a plurality of aircraft 102, a plurality of ground stations 104, a plurality of ground antennas 106, a plurality of satellites 108, a plurality of ground transmitters 110 and a plurality of ground vehicles 112. In the aeronautical communications environment 100, the aircraft 102, ground stations 104, ground antennas 106, satellites 108, ground transmitters 110 and ground vehicles 112 can communicate with each other to exchange air traffic data, weather data, or other data relevant to maintaining operations and safety of aircraft 102 and ground vehicles 112.

Each aircraft 102 and ground vehicle 112 can receive positioning signals from one or more satellites 108 and/or ground transmitters 110. The positioning signals received from the satellite(s) 108 and/or ground transmitters 110 can include timing information, such as an indication of a time instant according to timing signals of the satellite(s) and/or a general navigation satellite system (GNSS) clock signal. The aircraft 102 and/or ground vehicles 112 can include a global positioning system (GPS) device, or other navigation device, configured to use the positioning signals received from the satellite(s) 108 and/or ground transmitters 110 to determine a position of the aircraft 102 and/or ground vehicles 112. In particular, each navigation device can determine the position of the respective aircraft and/or ground vehicle using the position and timing information included in each received satellite signal and/or ground transmitter signal as well as the relative time delays associated with the reception of such signals.

Each aircraft 102 and/or ground vehicle 112 can communicate with one or more ground stations 104 via air-ground communication links. Also, each aircraft 102 and/or ground vehicle 112 may communicate with other aircraft 102 and/or ground vehicle 112 via air-air data links. Each aircraft 102 and/or ground vehicle 112 can receive from ground stations 104 or other aircraft 102 and/or ground vehicles 112 data indicative of the identity, location and/or speed of other vehicles, weather information, and/or other information relevant to the safety and operation of that aircraft 102 and/or ground vehicles 112. Each aircraft 102 and/or ground vehicle 112 can transmit (or broadcast) data indicative of its identity, location, speed, destination, engine (or electro-mechanical) health, and/or onboard safety information. The ground antenna 106 can communicate with one or more of the satellite(s) 108 to convey or exchange data. For instance, the ground antenna 106 can receive data from one or more ground stations 104 and transmit the received data to one or more satellites 108 for sending to aircraft 102 and/or ground vehicles 112. The ground antenna 106 can also receive data from one or more satellites 108 and transmit the received data to one or more ground stations 104. The ground transmitters 110 can transmit data to aircraft 102 and/or ground vehicles 112.

The air-ground data links and/or the air-air data links can include very high frequency (VHF) data links according to example embodiments described herein. Specifically, such data links can be configured to support data rates significantly higher than the maximum data rate associated with VHF Datalink Mode 2 (VDLM2) channels. Such data links can include VHF communications channels having a respective bandwidth greater than or equal to 8.33 kHz and with a maximum bit rate per Hertz of bandwidth greater than or equal to 3 bits per second per Hertz (bps/Hz) for each channel. For example, the maximum bit rate for a VHF communications channel having a bandwidth equal to 8.33 kHz can be greater than or equal to 25 kilo bits per second (kbps). By way of further illustration, the maximum bit rate for a VHF communications channel having a bandwidth equal to 25 kHz can be greater than or equal to 75 kbps, the maximum bit rate for a VHF communications channel having a bandwidth equal to 50 kHz can be greater than or equal to 150 kbps, the maximum bit rate for a VHF communications channel having a bandwidth equal to 75 kHz can be greater than or equal to 225 kbps, and the maximum bit rate for a VHF communications channel having a bandwidth equal to 100 kHz can be greater than or equal to 300 kbps.

Providing aeronautical data links with relatively high data rates (e.g., compared to existing VDLM2 data links) would entail changes in the aircraft communications infrastructure. Some of the avenues for increasing the data rates of aeronautical data links may include replacing the VHF band, which is heavily congested, with other frequency bands. For instance, the L-band Digital Aeronautical Communication System (LDACS) operates in the L-band. Also, the Aeronautical Mobile Airport Communications System (Aero-MACS) is configured to operate in the Aeronautical Mobile (Route) Service (AM(R)S) spectrum (e.g., 5091-5150 MHz). However, these communications systems would call for an entirely new ground infrastructure to be built in order to implement these new communication systems, at considerable cost. Also, aircraft operators would also have to invest a significant amount of money to equip their aircraft with new radios to utilize these new communication systems.

According to inventive concepts described herein, some embodiments of the aeronautical VHF communications systems and methods can provide aeronautical VHF data links with relatively high data rates. For instance, improved aeronautical VHF transceivers described herein can be configured to operate according to VHF channels having a bandwidth greater than or equal to 8.33 kHz, and a maximum bit rate per Hertz of bandwidth greater than or equal to 3 bps/Hz for each channel. The bit rate per Hertz is defined herein as the data rate (or bit rate) for a given VHF communication channel divided by the bandwidth of that VHF communication channel.

Figure 2:
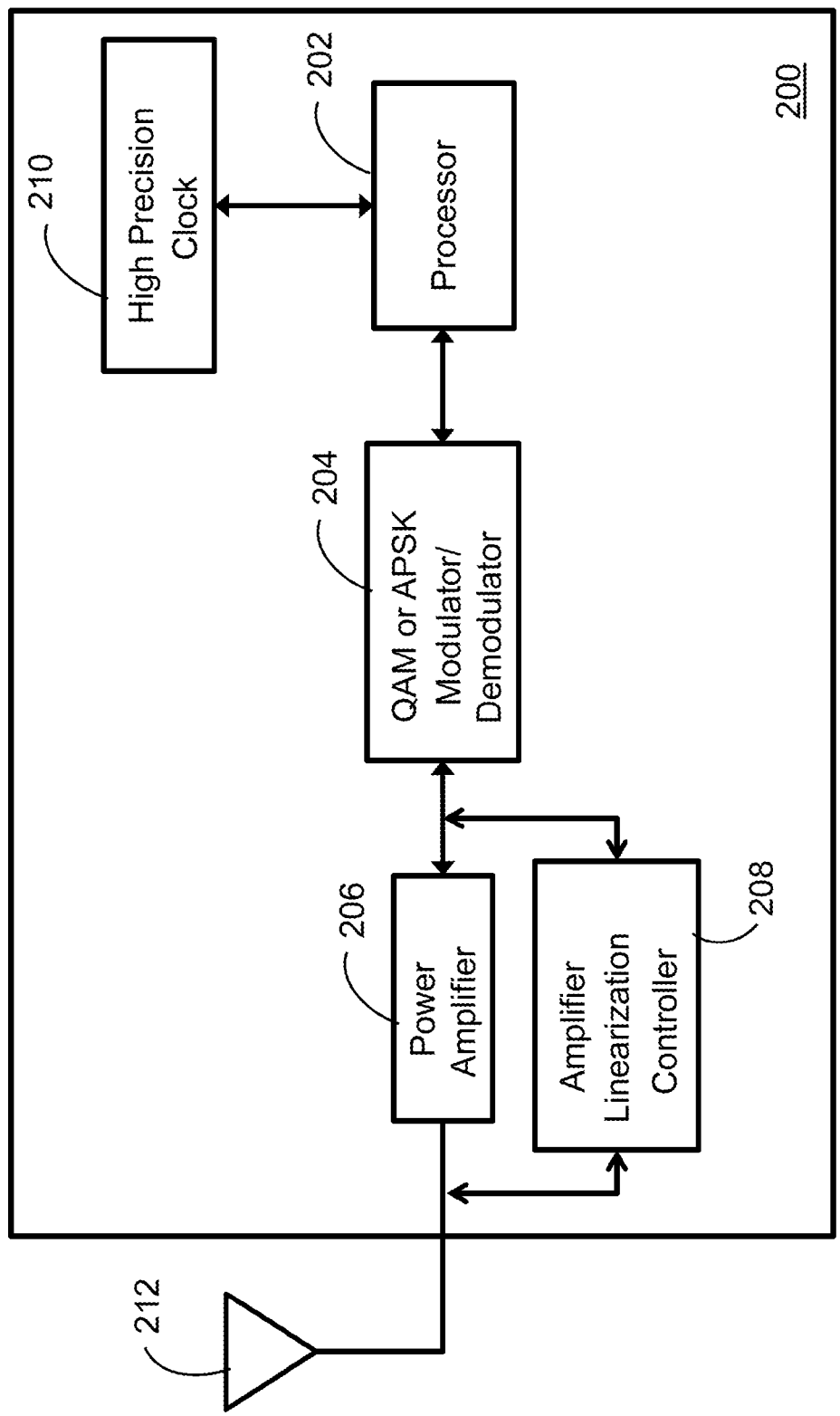
FIG. 2 shows a block diagram illustrating an example embodiment of a VHF transceiver, according to inventive concepts of this disclosure.

Referring now to FIG. 2, a block diagram illustrating an example embodiment of VHF transceiver 200 is shown. The VHF transceiver 200 can include processor 202, a modulator/demodulator 204, a power amplifier 206, an amplifier linearization controller 208 and a high precision clock 210. The VHF transceiver 200 can include, or be coupled to, an antenna 212. The VHF transceiver 200 can be deployed in an aircraft, ground vehicle, or a ground station. The VHF transceiver 200 can be configured to transmit and/or receive VHF signals. In some embodiments, the VHF transceiver 200 can be implemented as a separate VHF transmitter and a separate VHF receiver.

The VHF transceiver 200 can include a modulator/demodulator 204. When the VHF transceiver is operating in transmission mode (i.e., transmitting VHF signals), the modulator/demodulator 204 can modulate signals for transmission according to quadrature amplitude modulation (QAM) modulation schemes or according to amplitude and phase shift keying (APSK) modulation schemes. When the VHF transceiver is operating in receiving mode (i.e., receiving VHF signals), the modulator/demodulator 204 can demodulate received signals according to QAM modulation schemes or according to APSK modulation schemes. In some embodiments, the modulator/demodulator 204 can be configured to support both QAM modulation and APSK modulation. In such embodiments, the modulator/demodulator 204 can switch between QAM modulation and APSK modulation. In some other embodiments, the modulator/demodulator 204 can be configured to support either QAM modulation or APSK modulation. In some embodiments, the modulator/demodulator 204 can be implemented as a separate modulator and a separate demodulator.

The modulator/demodulator 204 can include a modulation module for mapping digital symbols to respective base signals, and a demodulation module for mapping received base signals to corresponding digital symbols. The modulation and/or demodulation modules can be implemented as software modules executable by the processor 202. The modulator/demodulator 204 can include, or be coupled to, a digital up converter (DUC) to up-sample base digital signals, and a digital-to-analog converter (DAC) to convert the up-sampled base digital signals into respective analog signals. The modulator/demodulator 204 can also include, or be coupled to, an analog-to-digital converter (ADC) to convert received VHF signals to corresponding digital signals, and a digital down converter (DDC) to down-sample the corresponding digital signals. The modulator/demodulator 204 can also be coupled to one or more mixers to convert analog base signals to analog VHF signals and convert analog VHF signals to analog base signals.

Both QAM and ADPSK modulations can provide superior performance with regard to spectral efficiency compared to other modulation schemes, such as the D8PSK modulation scheme employed by VHF transceivers compliant with VDLM2. In particular, QAM and APSK can provide higher order modulation schemes compared to, for example, D8PSK as QAM and APSK can allow for larger numbers of bits per symbol. Accordingly, employing QAM or APSK modulation by the VHF transceiver 200 allows for higher data rate compared to VDLM2 transceivers.

Referring now to FIGS. 3A and 3B, diagrams illustrating example QAM constellations with associated power levels are shown, in accordance with inventive concepts disclosed herein. The modulator/demodulator 204 can employ one or more QAM schemes, such as 16 QAM, 32 QAM, 64 QAM, 128 QAM, and/or 256 QAM. FIG. 3A shows a diagram of an example 16 QAM constellation, where each dot represents a respective symbol in the I-Q plane. FIG. 3B shows a diagram of an example 32 QAM constellation with 32 symbols, represented by the dots, in the I-Q plane. The dashed circles in both figures represent the various power levels associated with each of the QAM constellations, employed by a modulator/demodulator. In particular, the 16 QAM constellation includes four power levels whereas the 32 QAM constellation includes eight power levels.

Figure 4B:
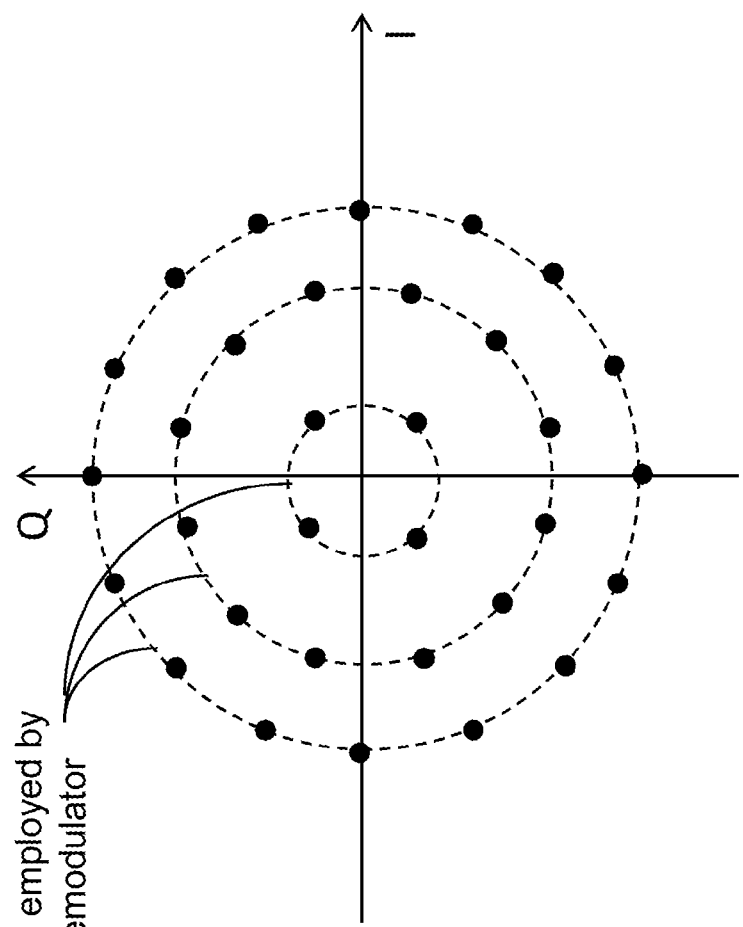
FIGS. 4A and 4B show diagrams illustrating example embodiments of two amplitude and phase shift keying (APSK) modulation constellations.
Figure 4A:
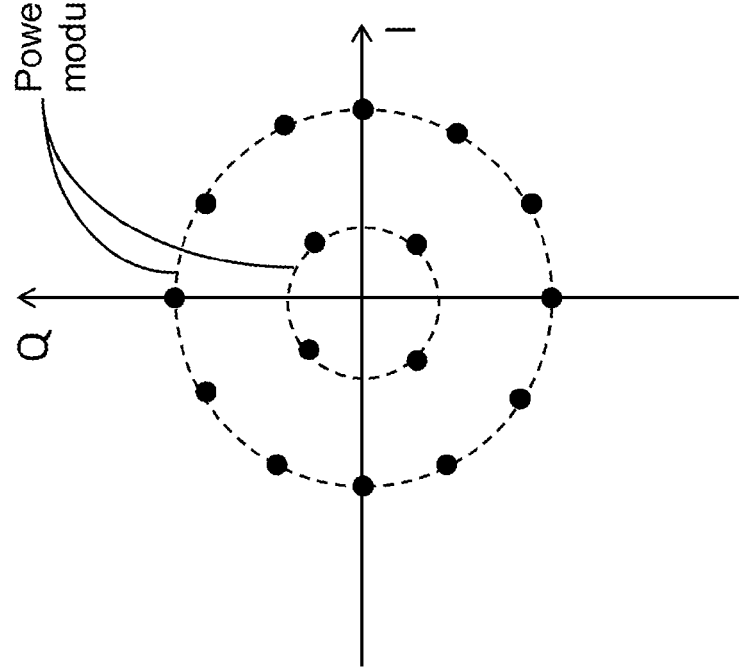

Referring now to FIGS. 4A and 4B, diagrams illustrating example APSK constellations with associated power levels are shown, in accordance with inventive concepts disclosed herein. The modulator/demodulator 204 can employ one or more APSK schemes, such as 16 APSK, 32 APSK, 64 APSK, 128 APSK, and/or 256 APSK. FIG. 4A shows a diagram of an example 16 APSK constellation, where each dot represents a respective symbol in the I-Q plane. FIG. 4B shows a diagram of an example 32 APSK constellation with 32 symbols, represented by the dots, in the I-Q plane. Similar to FIGS. 3A and 3B, the dashed circles in FIGS. 4A and 4B represent the various power levels associated with each of the APSK constellations, employed by the modulator/demodulator. The 16 APSK constellation includes two power levels whereas the 32 APSK constellation includes three power levels.

Considering the constellations in FIGS. 3A and 3B to those in FIGS. 4A and 4B, respectively, each QAM constellation includes a large number of power levels compared to the corresponding APSK constellation. For example, the 16 QAM constellation is associated with four power levels, whereas the 16 APSK constellation is associated with only two power levels. Also, while the 32 QAM constellation includes eight power levels, the 32 APSK constellation includes only three power levels. The larger numbers of power levels associated with the QAM modulation schemes, e.g., compared to corresponding APSK modulation schemes, implies larger peak to average power ratios for QAM modulation schemes compared to APSK modulation schemes.

The relatively large peak to average power ratios make QAM modulation schemes prone to non-linear effects of the power amplifier 206. Specifically, the non-linear effects of the power amplifier 206 can lead to performance degradation, especially for high order QAM modulation schemes. As such, the nonlinear effects of the power amplifier 206 can hinder the use of high order QAM modulation schemes by the modulator/demodulator 204. In some embodiments, the modulator/demodulator 204 can be configured to adapt the order of the QAM modulation scheme used based on one or more channel factors such as signal-to-noise-ratio (SNR), distance between the VHF transceiver 200 and one or more receiving devices, relative locations of the VHF transceiver and the one or more receiving devices, antenna gain, transmit power, or a combination thereof. Such adaptation allows for selecting a QAM modulation scheme order, for example, to achieve specific bit error rate (BER) under a given SNR. However, the nonlinear effects of the power amplifier 206 usually lead to lower SNR (e.g., compared to absence of such effects).

The APSK modulation schemes are associated with lower peak to average power ratios, and therefore perform better than the corresponding QAM modulation schemes in the presence of the nonlinear effects of the power amplifier 206. In particular, the APSK modulation schemes are more resilient to signal distortions introduced by power amplifier nonlinearities, compared to QAM modulation schemes of the same order. However, even with such better resiliency, the APSK modulation schemes still suffer performance degradation in the presence of power amplifier nonlinearity. The degradation in performance can hinder the use of high order APSK modulation schemes, but at a lesser degree compared to the degradation in performance for QAM modulation schemes. Similar to QAM modulation, the modulator/demodulator 204 can be configured to adapt the order of the APSK modulation scheme used based on the SNR.

Referring back to FIG. 2, the power amplifier 206 (or radio frequency (RF) amplifier) can be arranged intermediate between the modulator/demodulator (or the processor 202) and the antenna 212, and can be configured to amplify input signals. For instance, the power amplifier 206 can amplify analog modulated signals and provide the amplified signals to the antenna 212 for transmission. The power amplifier 206 can also amplify VHF signals received by the antenna 212 and provide the amplified signals to the modulator/demodulator 204 for demodulation.

The power amplifier 206 can be associated with a linear region of operation and a nonlinear region of operation. Within the linear region of operation, the power amplifier 206 amplifies an input power of an input signal by a multiplicative gain factor, such that the output power of the corresponding output signal is equal to the input power multiplied by the gain of the power amplifier. The nonlinear region of operation can include a saturation region and a nonlinear distortion region. The nonlinear distortion region is intermediate, with respect to the input and/or output power, between the linear region and the saturation region. Within the nonlinear distortion region, the power amplifier 206 can introduce (or generate) unwanted intermodulation signal components at some frequencies, therefore, distorting the frequency components of the original signal. The added intermodulation signal components can result in increased BER.

The VHF transceiver 200 can include an amplifier linearization controller 208 configured to correct for nonlinear distortions in output signals of the power amplifier 206. Amplifier linearization controller 208 can include electric (or electronic) circuitry coupled to the power amplifier. In some embodiments, the amplifier linearization controller 208 can be configured to employ pre-distortion amplifier linearization, Cartesian feedback amplifier linearization, feedforward amplifier linearization, or a combination thereof.

When employing pre-distortion amplifier linearization, the amplifier linearization controller 208 can add a signal correction term to the input signal of the power amplifier 206. The signal correction term is designed (or selected) such that when amplified by the power amplifier 206, it nullifies or substantially mitigates the intermodulation signal terms in the output signal of the power amplifier 206. As such, the distortion at the output signal can be eliminated or reduced, and the relationship between the input power and the output power becomes linear, or almost/substantially linear (e.g., the ratio of power of the remaining nonlinear signal terms divided by the total output power is less than 0.01, 0.001, or any other threshold value), within the nonlinear distortion region.

The Cartesian feedback amplifier linearization is based on two independent I and Q feedback loops. Specifically, the amplifier linearization controller 208 can be configured to generate I and Q output signal terms (corresponding to the output signal of the power amplifier 206). The amplifier linearization controller 208 can feedback the generated I and Q output signal terms to be subtracted from the I and Q input signals (corresponding to the input signal of the power amplifier 206). The subtraction of the generated I and Q output signal terms from the I and Q input signals eliminates or reduces the nonlinear distortion in the output signal of the power amplifier 206.

When employing feedforward amplifier linearization, the amplifier linearization controller 208 can generate an error signal (e.g., using a signal cancellation circuit) by subtracting an attenuated version of the output signal of the power amplifier from a time delayed version of the corresponding input signal. The amplifier linearization controller 208 can amplify the error signal (e.g., using a second power amplifier), and subtract the amplified error signal from the output signal of the power amplifier 206. The amplified error signal represents an estimate of the distortion signal introduced by the power amplifier 206. Accordingly, subtracting the amplified error signal from the output signal of the power amplifier eliminates or reduces the nonlinear distortion.

In some embodiments, the amplifier linearization controller 208 can employ a combination of the amplifier linearization techniques described above. For instance, the amplifier linearization controller 208 can employ a combination of pre-distortion amplifier linearization and Cartesian feedback amplifier linearization or a combination of pre-distortion amplifier linearization and feedforward amplifier linearization. The amplifier linearization controller 208 can alternatively employ a combination of Cartesian feedback amplifier linearization and feedforward amplifier linearization.

The amplifier linearization controller 208 can allow operating the power amplifier 206 within the corresponding nonlinear distortion region without significant nonlinear distortion. Specifically, the amplifier linearization controller 208 can allow operating the power amplifier 206 at higher power levels (compared to when no amplifier linearization is employed). Accordingly, the VHF transceiver 200 (or the modulator/demodulator 204) can employ high order QAM or APSK modulation schemes (e.g., 128 QAM, 256 QAM, 128A PSK and/or 256 APSK) without significant degradation in BER, and, therefore, allow the VHF transceiver 200 to operate at higher bit rate than existing VLDM2 transceivers.

In some embodiments, the VHF transceiver 200 can be configured to operate at a plurality of VHF channels, each having a bandwidth greater than or equal to 8.33 kHz for instance. The VHF channels can be defined within today's aircraft VHF communications band ranging between 118 MHz and 137 MHz, the VHF omnidirectional radio (VOR) band ranging between 112 MHz and 118 MHz, and the Instrument Landing System Localizer (LOC) band ranging between 108 MHz and 112 MHz, or any combination thereof. The plurality of VHF channels can include one or more digital voice communications channels. The plurality of VHF channels can include one or more digital data communications channels. By employing amplifier linearization techniques and QAM or APSK modulation schemes, the VHF transceiver 200 can operate at a maximum bit rate per Hertz greater than or equal to three bps/Hz, for each VHF channel. For instance, for a VHF channel with a bandwidth equal to 8.33 kHz, the VHF transceiver can operate at a maximum data rate greater than or equal to 25 kbps. For a VHF channel with a bandwidth of 25 kHz, the respective maximum data rate can be greater than or equal to 75 kbps. For a VHF channel with a bandwidth of 50 kHz, the respective maximum data rate can be greater than or equal to 150 kbps. For a VHF channel with a bandwidth of 75 KHz, the respective maximum data rate can be greater than or equal to 225 kbps. Also, for a VHF channel with a bandwidth of 100 kHz, the respective maximum data rate can be greater than or equal to 300 kbps. Furthermore, by employing amplifier linearization techniques and QAM or APSK modulation schemes, the VHF transceivers 200 (e.g., deployed at aircraft and/or ground stations) can exchange data via the VHF channels with an uncorrected BER of less than 0.001.

The antenna 212 can obtain VHF signals from the power amplifier 206 and transmit them to other VHF transceivers 200. The antenna 212 can be configured to operate at a transmit range of at least two nautical miles. The antenna 212 can also receive VHF signals transmitted by other VHF transceivers 200 and provide the received VHF signals to the power amplifier 206 for amplification. In some embodiments, the VHF transceiver 200 can include a power amplifier 206 to amplify transmission signals and another one for amplifying received signals.

The processor 202 can be configured to execute computer code instructions to perform one or more operations, such as switching between transmit and receive modes, controlling the operation of the modulator/demodulator 204, performing baseband processing, and/or synchronizing with ground stations. In some embodiments, ground stations (such as ground stations 104 shown in FIG. 1) can be configured to employ time division multiple access. For instance, a ground station VHF transceiver 200 can broadcast indications of available time slots associated with the VHF channels. Upon receiving such indications, a processor 202 of an aircraft VHF transceiver 200 (or of another ground station VHF transceiver 200) can select a time slot among the available time slots and cause the VHF transceiver 200 to transmit an indication of the selected time slot to the broadcasting ground station. Once an acknowledgement is received from the broadcasting ground station, the processor 202 can initiate data transmission (or data reception) at the start of the selected time slot.

In order to accurately operate the VHF transceiver 200 at selected time slots, the processor 202 can receive GNSS time signals (or GNSS clock signals) from the satellite(s) 108 (shown in FIG. 1) for synchronizing a clock of the VHF transceiver 200 (such as the high precision clock 210) with GNSS time. Responsive to receiving the GNSS time signals, the processor 202 can be configured to synchronize the high precision clock 210 with the GNSS time. For instance, the processor 202 can instruct the high precision clock 210 to correct a respective time drift, for example, by adjusting a respective clock signal. The processor can also determine to initiate transmission of the VHF signals over the first channel, in accordance with one or more factors that include signal-to-noise ratio (SNR) associated with the first VHF channel (or the plurality of VHF channels), distance between the transmitting device and one or more receiving devices, relative locations of the transmitting device and the one or more receiving devices, antenna gain, transmit power, or a combination thereof. For instance, the processor determine an order of an APSK (or QAM) modulation scheme for use in modulating the signals based on one or more of these factors.

The high precision clock 210 can have a time precision within 100 microseconds (or within a time period corresponding to a duration of single symbol). In some implementations, The high precision clock 210 can include, for example, an atomic clock. Atomic clocks can provide better timing accuracy compared to, for example, other clocks using oven-controlled crystal oscillators (OCXOs) or temperature-controlled oscillators (TCXOs). Also, atomic clocks provide smaller time drift than other clocks when operated over a given time period without synchronization with a reference time signal. Accordingly, the high precision clock 210 can maintain accurate timing during time periods of GNSS outage, and allow the VHF transceiver 200 to communicate reliably with other VHF transceivers 200 (such as a ground station VHF transceiver) over such time periods.

A substantial drift in the clock signal of the VHF transceiver 200 results in poor synchronization with ground stations with respect to the start and end of time slots, and, therefore, degradation in communication quality between ground stations, aircraft, and ground vehicles. The high precision clock 210 can allow the VHF transceiver to maintain a precise time reference that has an error that is less than 100 microseconds (µs) from the coordinated time reference used for the high speed VHF communication system (such as the Universal Time Coordinated (UTC)). Accordingly, the high precision clock 210 can allow the VHF transceiver 200 to maintain proper operation within the defined TDMA time slot structure.

Figure 5:
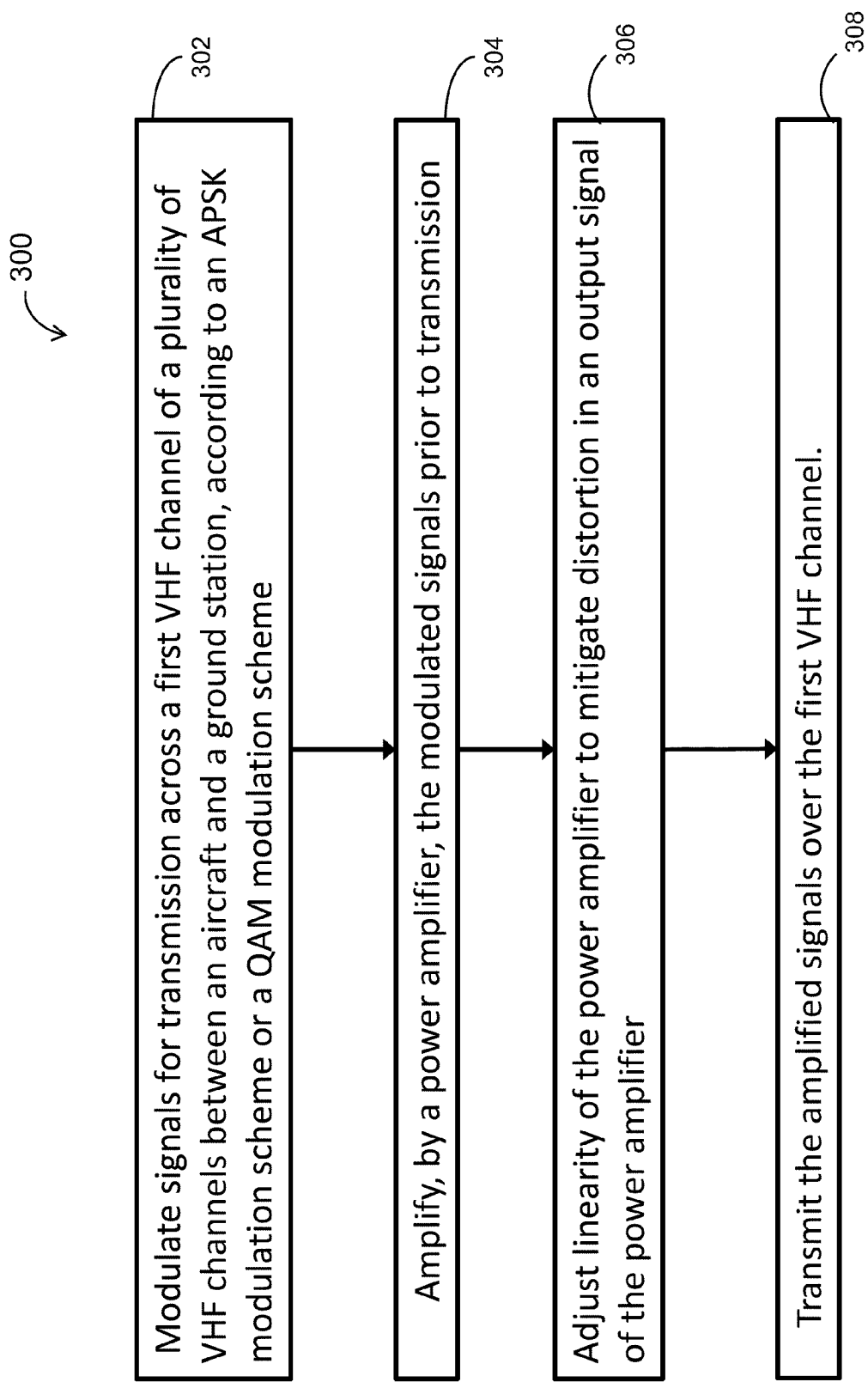
FIG. 5 shows a flowchart illustrating an example embodiment of a method for transmitting VHF signals, according to inventive concepts of this disclosure.

Referring now to FIG. 5, a flowchart illustrating one embodiment of a method 300 of transmitting VHF signals. The method 300 can include modulating signals for transmission across a first VHF channel of a plurality of VHF channels to communicate between aircraft, ground vehicles, and/or ground stations, according to an APSK modulation scheme or a QAM modulation scheme (step 302). A power amplifier can amplify the modulated signals prior to transmission (step 304). A linearity controller (such amplifier linearization controller 204) can adjust linearity of the power amplifier to mitigate distortion in an output signal of the power amplifier (step 306). The method 300 can also include transmitting the amplified signals over the first VHF channel (step 308).

The method 300 can include a modulator/demodulator modulating signals for transmission across a first VHF channel of a plurality of VHF channels to communicate between an aircraft, ground vehicles, and/or ground stations, according to an APSK modulation scheme or a QAM modulation scheme (step 302). As described above with regard to FIG. 2, the modulator/demodulator 204 can convert digital APSK data symbols (or digital QAM symbols) to corresponding APSK base signals (or corresponding QAM base signals). The VHF transceiver 200 can also up-sample the base signals and convert them to respective analog signals. The VHF transceiver 200 can also employ a mixer to convert the analog base signals to corresponding bandpass signals within the frequency band of the first VHF channel.

The method 300 can include a power amplifier (such as power amplifier 206) amplifying the modulated signals prior to transmission (step 304). For instance, the power amplifier can receive the bandpass signals as input and generate amplified versions as output.

The method 300 can include adjusting, by an amplifier linearization controller, linearity of the power amplifier to mitigate distortion in an output signal of the power amplifier (step 306). As discussed above with regard to FIG. 2, the amplifier linearization controller 206 can employ Cartesian amplifier feedback linearization, pre-distortion amplifier linearization, feedforward amplifier linearization or a combination thereof. The amplifier linearization can control linearity of the power amplifier to support the data rate per Hz greater than or equal to 3 b/s/Hz when the bandwidth of the first VHF channel is at least 28.33 kHz, according to at least one of a Cartesian feedback amplifier linearization, pre-distortion amplifier linearization or feedforward amplifier linearization, to mitigate nonlinear distortion associated with signals output by the power amplifier The method 300 can also include transmitting the amplified signals over the first VHF channel (step 308). For instance, an antenna (such as antenna 212 in FIG. 2) can obtain the amplified signals with mitigated nonlinear distortions and transmit them to other VHF transceivers 200.

The method 300 can further include a processor determining to initiate transmission of the VHF signals over the first channel, in accordance with one or more factors that include signal-to-noise ratio (SNR) associated with the first VHF channel (or the plurality of VHF channels), distance between the transmitting device and one or more receiving devices, relative locations of the transmitting device and the one or more receiving devices, antenna gain, transmit power, or a combination thereof. The determination can include determining an order of an APSK (or QAM) modulation scheme for use in modulating the signals based on one or more of these factors. The method 300 can further include the processor 202 receiving indications of available TDMA time slots to transmit signals over the first VHF channel, selecting a time slot among the TDMA time slots, and initiating transmission at the start of the selected time slot.

The construction and arrangement of the systems and methods are described herein as illustrative examples and are not to be construed as limiting. Although only a few embodiments have been described in detail in this disclosure, many modifications are possible (e.g., variations in sizes, dimensions, structures, shapes and proportions of the various elements, values of parameters, mounting arrangements, use of materials, colors, orientations). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method of operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

What is claimed is:

1. A very high frequency (VHF) communications transceiver mounted on an aircraft, comprising:
an amplitude and phase shift keying (APSK) modulator configured to modulate signals for transmission across a first VHF channel of a plurality of VHF channels used to communicate between or among aircraft and one or more ground stations, each of the VHF channels having a bandwidth of at least 8.33 kilo Hertz (kHz), with a data rate per Hertz (Hz) of the bandwidth greater than or equal to 3 bits per second per Hz (bps/Hz);

a power amplifier configured to amplify the modulated signals prior to the transmission;

a linearity controller configured to control linearity of the power amplifier according to at least one of a Cartesian feedback amplifier linearization, pre-distortion amplifier linearization or feedforward amplifier linearization to mitigate nonlinear distortion associated with signals output by the power amplifier;

a receiver configured to receive an indication of one or more time slots from the one or more ground stations, the one or more ground stations employing time division multiple access (TDMA) using the one or more time slots for communications with the aircraft; and a processor configured to select a first time slot of the one or more time slots, and to initiate the transmission according to the first time slot and a timing signal, the timing signal obtained based on a global navigation satellite system (GNSS) time signal or a clock device having time precision within 100 microseconds.

2. The VHF communications transceiver of claim 1, the VHF communications transceiver having an operational bandwidth ranging between 108 mega Hertz (MHz) and 137 MHz.

3. The VHF communications transceiver of claim 1, wherein the plurality of VHF channels include at least one channel configured for digital voice communications.

4. The VHF communications transceiver of claim 1, wherein the plurality of VHF channels include at least one channel configured for digital data communications.

5. The VHF communications transceiver of claim 1, further comprising an antenna for transmitting signals amplified by the power amplifier with mitigated nonlinear distortion, the transmitted signals received by another VHF communications transceiver with uncorrected bit error rate of less than or equal to 0.001.

6. The VHF communications transceiver of claim 1, further comprising an antenna with a transmit range of at least two nautical miles.

7. The VHF communications transceiver of claim 1 further comprising a processor configured to determine to transmit the modulated signals via the first VHF channel, according to one or more factors of the first VHF channel including signal-to-noise ratio, distance between the VHF communications transceiver and one or more receiver devices, relative locations of the VHF communications transceiver and the one or more receiver devices, antenna gain, or transmit power.

8. The VHF communications transceiver of claim 1, wherein the plurality of VHF channels are used to communicate between or among the aircraft, the one or more ground stations and one or more ground vehicles.

9. A system for very high frequency (VHF) communications mounted on an aircraft, the system comprising:

a transceiver modulator configured to modulate signals using amplitude and phase shift keying (APSK) for amplification using a power amplifier prior to transmission across a first VHF channel of a plurality of VHF channels used to communicate between or among aircraft and one or more ground stations, the first VHF channel having a bandwidth of at least 8.33 kilo Hertz (kHz), with a data rate per Hertz (Hz) of the bandwidth greater than or equal to 3 bits per second per Hz (bps/Hz);

an amplifier controller configured to control linearity of the power amplifier to support the data rate per Hz greater than or equal to 3 bps/Hz when the bandwidth of the first VHF channel is at least 8.33 kHz, according to at least one of a Cartesian feedback amplifier linearization, pre-distortion amplifier linearization or feedforward amplifier linearization, to mitigate nonlinear distortion associated with signals output by the power amplifier;

a receiver configured to receive an indication of one or more time slots from the one or more ground stations, the one or more ground stations employing time division multiple access (TDMA) using the one or more time slots for communications with the aircraft; and a processor configured to select a first time slot of the one or more time slots, and to initiate the transmission according to the first time slot and a timing signal, the timing signal obtained based on a global navigation satellite system (GNSS) time signal or a clock device having time precision within 100 microseconds.

10. The system of claim 9, the VHF communications transceiver having an operational bandwidth ranging between 108 mega Hertz (MHz) and 137 MHz.

11. The system of claim 9, wherein the plurality of VHF channels include at least one channel configured for digital voice communications.

12. The system of claim 9, wherein the plurality of VHF channels include at least one channel configured for digital data communications.

13. The system of claim 9, further comprising an antenna for transmitting signals amplified by the power amplifier with mitigated nonlinear distortion, the transmitted signals received by a receiving system with uncorrected bit error rate of less than or equal to 0.001.

14. The system of claim 9 further comprising a processor configured to determine to transmit the modulated signals via the first VHF channel, according to one or more factors of the first VHF channel including signal-to-noise ratio, distance between the system and one or more receiving systems, relative locations of the system and the one or more receiving systems, antenna gain, or transmit power.

15. A method of a very high frequency (VHF) communications transceiver mounted on an aircraft, the method comprising:

modulating, by an amplitude and phase shift keying (APSK) modulator, signals for transmission across a first VHF channel of a plurality of VHF channels used to communicate between or among aircraft and one or more ground stations, each of the VHF channels having a bandwidth of at least 8.33 kilo Hertz (kHz), with a data rate per Hertz (Hz) of the bandwidth greater than or equal to 3 bits per second per Hz (bps/Hz);

amplifying, by a power amplifier, the modulated signals prior to the transmission;

adjusting, by a linearity controller, linearity of the power amplifier according to at least one of a Cartesian feedback amplifier linearization, pre-distortion amplifier linearization or feedforward amplifier linearization to mitigate nonlinear distortion associated with signals output by the power amplifier;

receiving an indication of one or more time slots from the one or more ground stations, the one or more ground stations employing time division multiple access (TDMA) using the one or more time slots for communications with the aircraft; and selecting, by a processor, a first time slot of the one or more time slots, and to initiate the transmission according to the first time slot and a timing signal, the timing signal obtained based on a global navigation satellite system (GNSS) time signal or a clock device having time precision within 100 microseconds.

16. The method of claim 15 further comprising determining, by a processor, to transmit the modulated signals via the first VHF channel, according to one or more factors of the first VHF channel including signal-to-noise ratio, distance between the VHF communications transceiver and one or more receiving devices, relative locations of the VHF communications transceiver and the one or more receiving devices, antenna gain, or transmit power.

* * * * *